(12) United States Patent
Pindl et al.

(10) Patent No.: US 9,281,453 B2
(45) Date of Patent: Mar. 8, 2016

(54) METHOD FOR PRODUCING AN OPTOELECTRONIC COMPONENT, AND OPTOELECTRONIC COMPONENT

(75) Inventors: Markus Pindl, Tegernheim (DE);
Harald Jäger, Regensburg (DE);
Stephan Preuβ, Bad Abbach (DE);
Herbert Brunner, Sinzing (DE)

(73) Assignee: OSRAM Opto Semiconductors GmbH (DE)

( * ) Notice: Subject to any disclaimer, the term of this patent is extended or adjusted under 35 U.S.C. 154(b) by 191 days.

(21) Appl. No.: 13/995,847

(22) PCT Filed: Dec. 7, 2011

(86) PCT No.: PCT/EP2011/072064
§ 371 (c)(1),
(2), (4) Date: Sep. 3, 2013

(87) PCT Pub. No.: WO2012/084516
PCT Pub. Date: Jun. 28, 2012

(65) Prior Publication Data
US 2013/0334558 A1    Dec. 19, 2013

(30) Foreign Application Priority Data
Dec. 21, 2010   (DE) .......................... 10 2010 063 760

(51) Int. Cl.
*H01L 21/00* (2006.01)
*H01L 33/50* (2010.01)
*H01L 33/54* (2010.01)

(52) U.S. Cl.
CPC .............. *H01L 33/50* (2013.01); *H01L 33/508* (2013.01); *H01L 33/54* (2013.01); *H01L 2224/48091* (2013.01); *H01L 2224/8592* (2013.01); *H01L 2933/0041* (2013.01)

(58) Field of Classification Search
CPC combination set(s) only.
See application file for complete search history.

(56) References Cited

U.S. PATENT DOCUMENTS

| | | | |
|---|---|---|---|
| 2004/0104391 A1 | 6/2004 | Maeda et al. | |
| 2005/0110401 A1 | 5/2005 | Lin | |
| 2006/0073625 A1 | 4/2006 | Harada | |
| 2006/0262320 A1* | 11/2006 | Kawasaki et al. | 356/495 |
| 2008/0099727 A1 | 5/2008 | Sakano et al. | |

FOREIGN PATENT DOCUMENTS

| | | |
|---|---|---|
| CN | 101101946 | 1/2008 |
| CN | 101752476 | 6/2010 |
| DE | 196 38 667 A1 | 4/1998 |
| DE | 10 2006 061 175 A1 | 6/2008 |

(Continued)

OTHER PUBLICATIONS

English translation of Chinese Office Action dated Jun. 30, 2015 of corresponding Chinese Application No. 201180061770.1.

*Primary Examiner* — Robert Bachner
(74) *Attorney, Agent, or Firm* — DLA Piper LLP (US)

(57) ABSTRACT

A method of producing an optoelectronic component includes providing a cavity; introducing a liquid matrix material with phosphor particles distributed therein into the cavity; introducing a semiconductor chip into the matrix material; sedimenting the phosphor particles in the matrix material; and curing the matrix material, wherein a conversion layer including phosphor particles is produced, said conversion layer being arranged on the semiconductor chip.

10 Claims, 19 Drawing Sheets

(56) References Cited

FOREIGN PATENT DOCUMENTS

| DE | 10 2007 053 067 A1 | 4/2009 |
|---|---|---|
| EP | 1 657 758 A2 | 5/2006 |
| JP | 2002-151743 | 5/2002 |
| TW | 201020582 | 6/2010 |
| WO | 2005/081319 A1 | 9/2005 |
| WO | 2010/017831 A1 | 2/2010 |
| WO | 2010/023993 A1 | 3/2010 |
| WO | 2010/035206 | 4/2010 |

\* cited by examiner

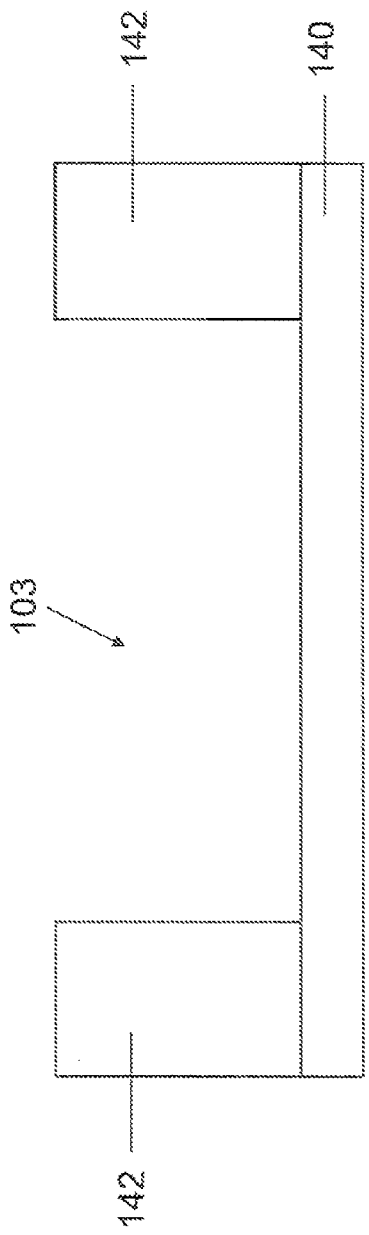
FIG A1.1
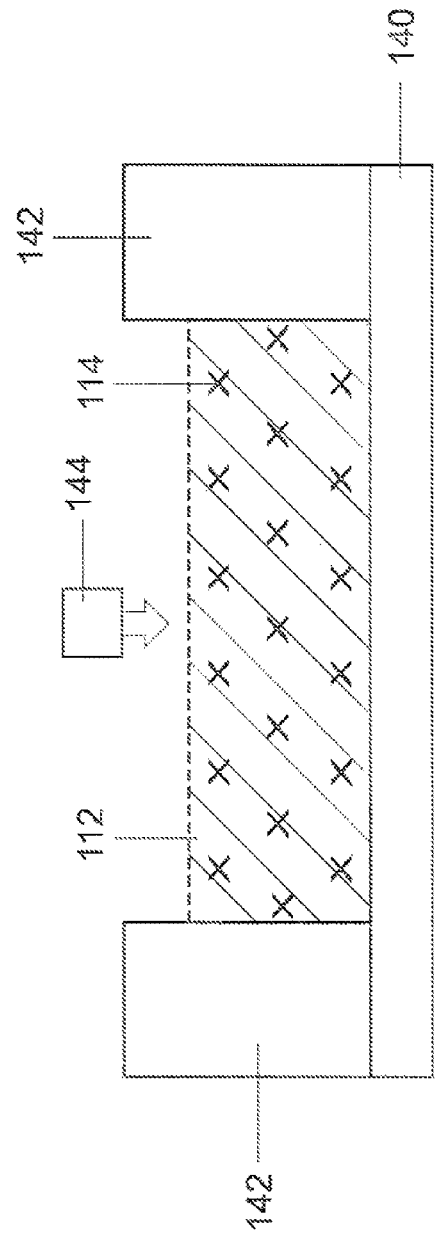
FIG A1.2

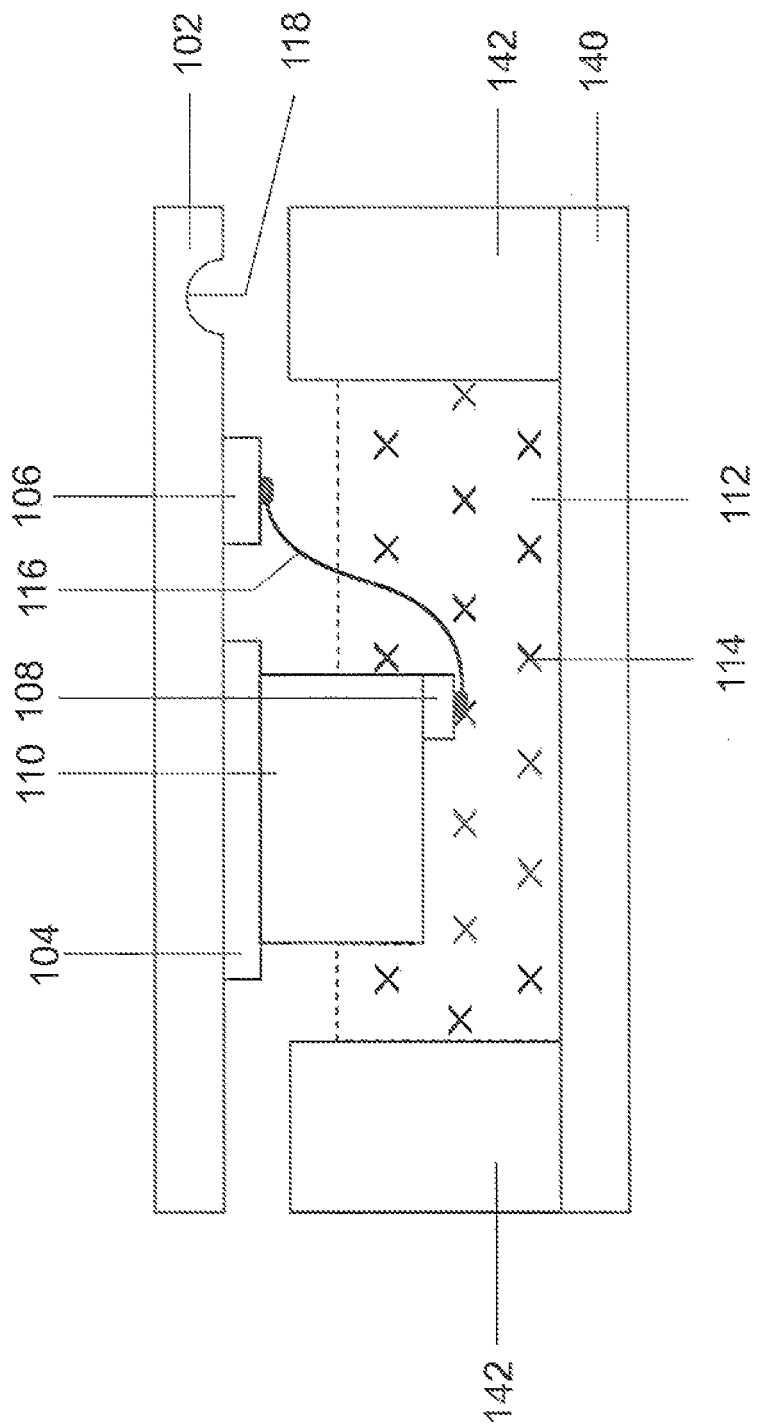
FIG. 1.3

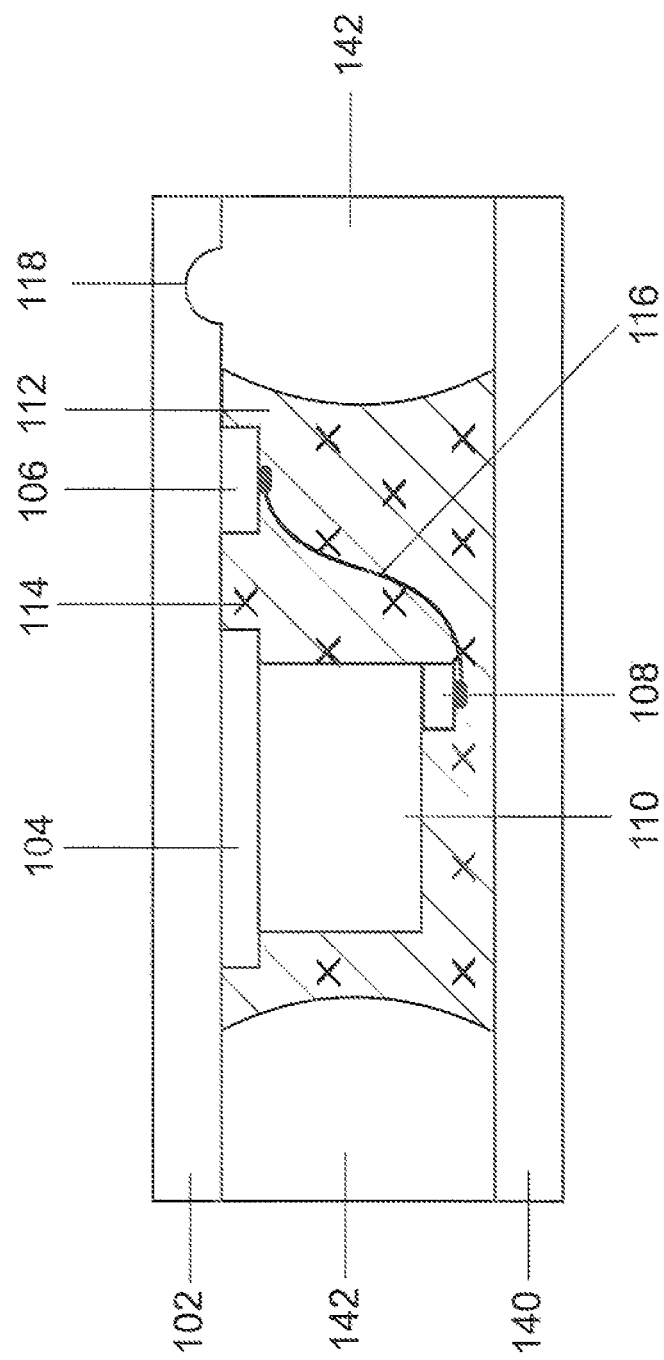
FIG A1.4

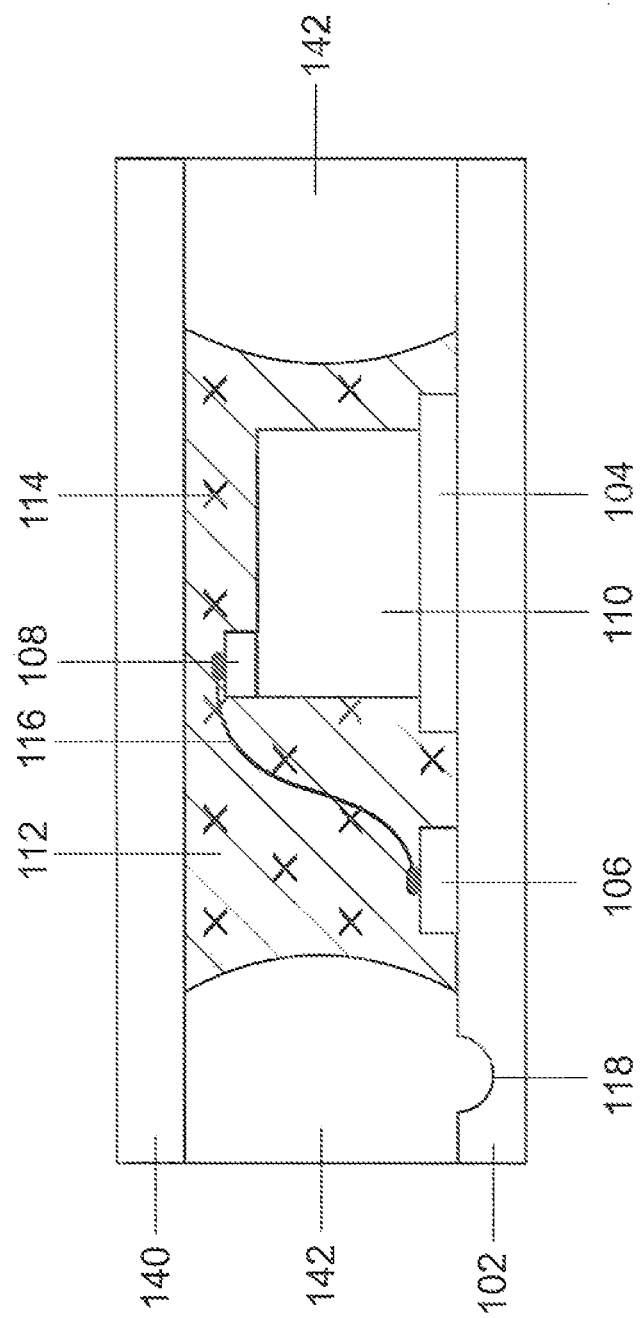
FIG A1.5

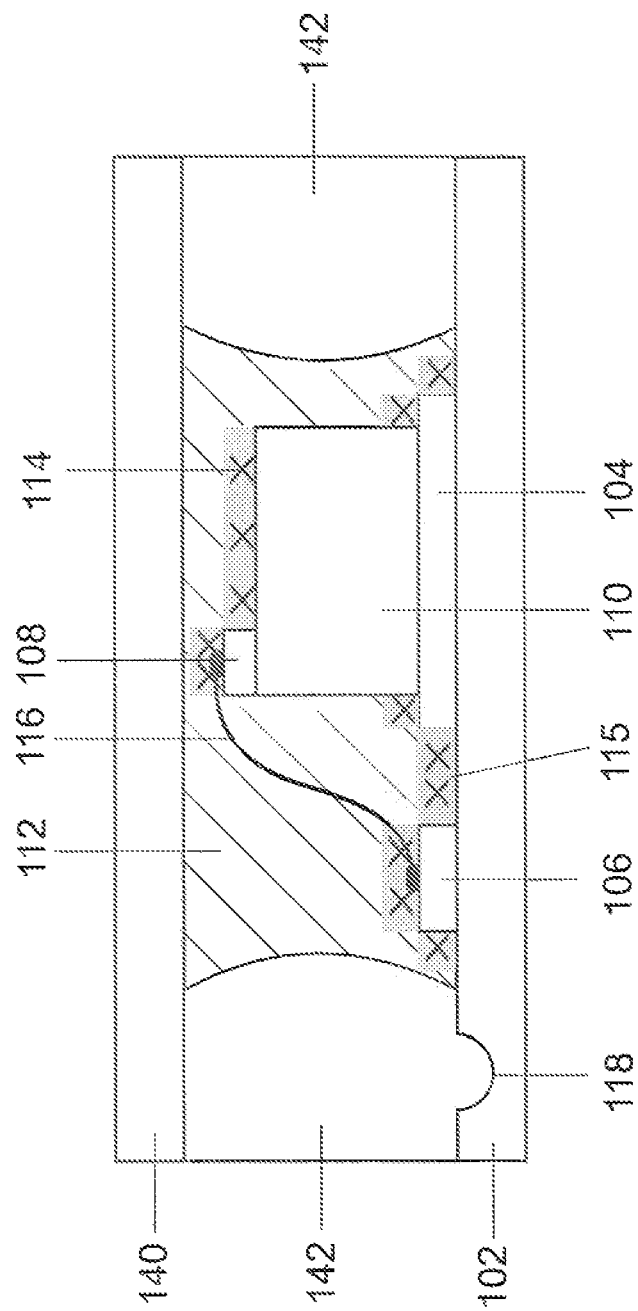
FIG A2

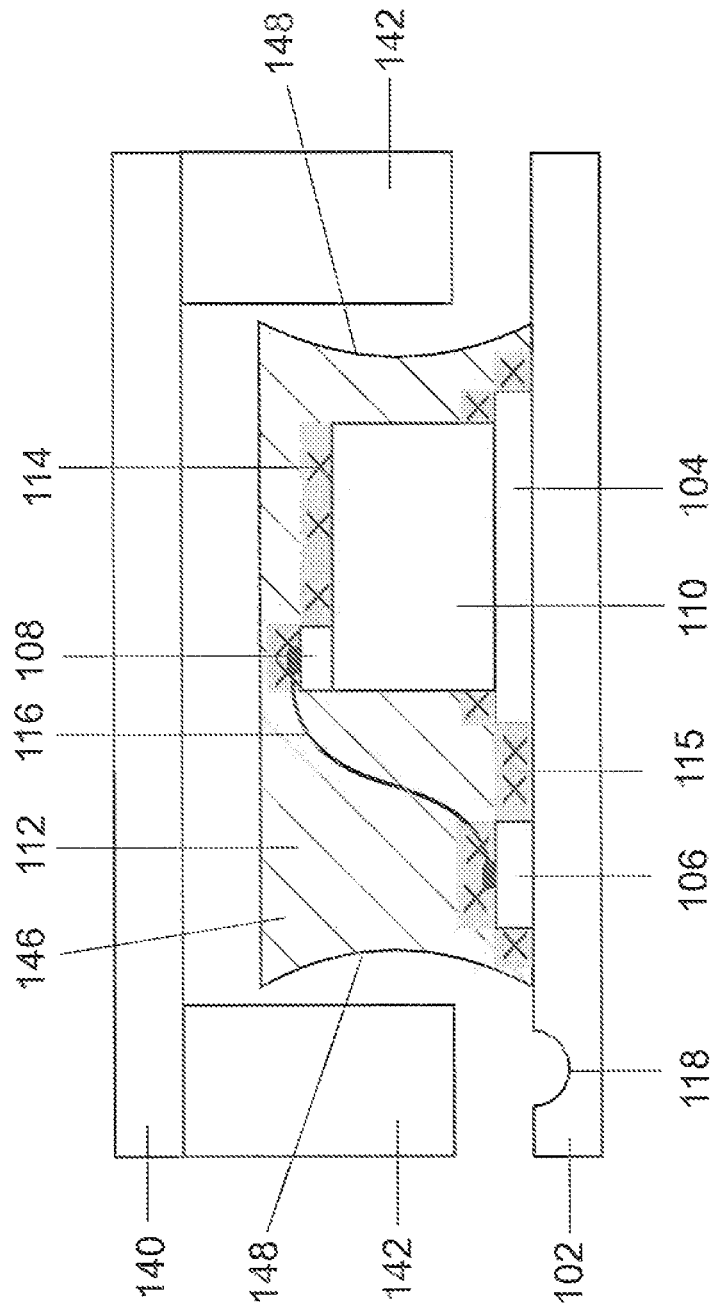
FIG A3

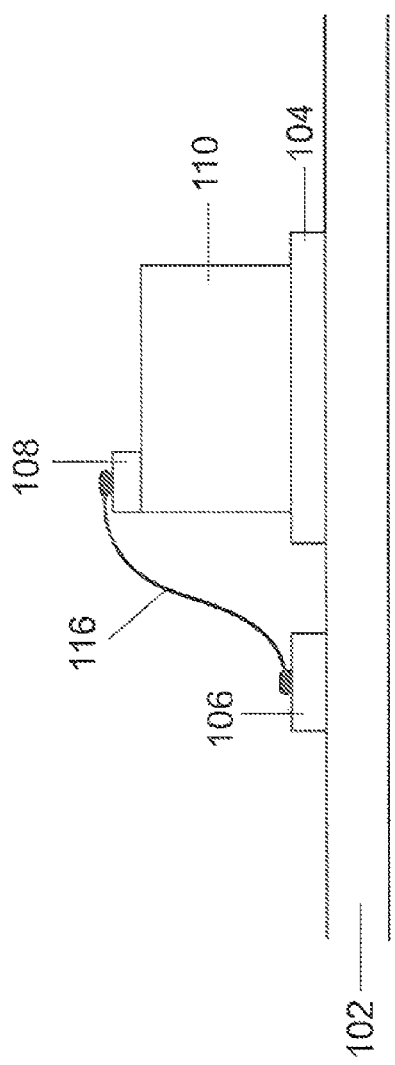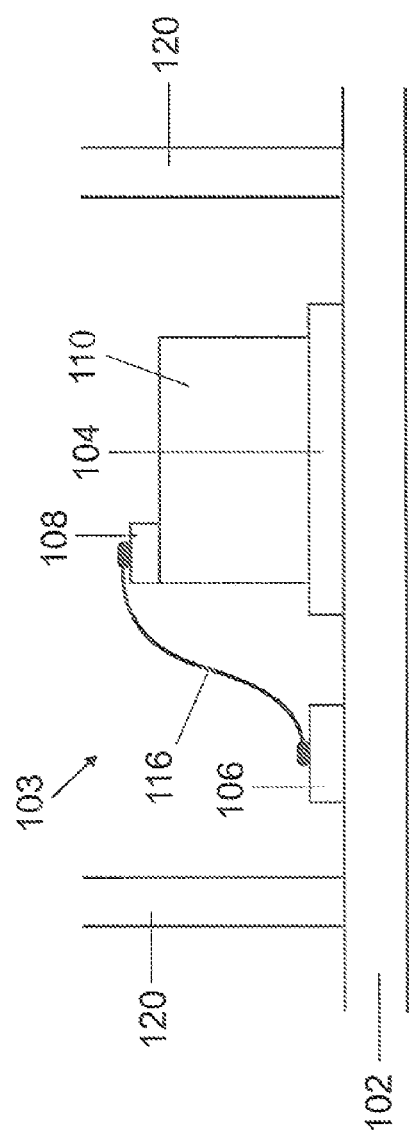

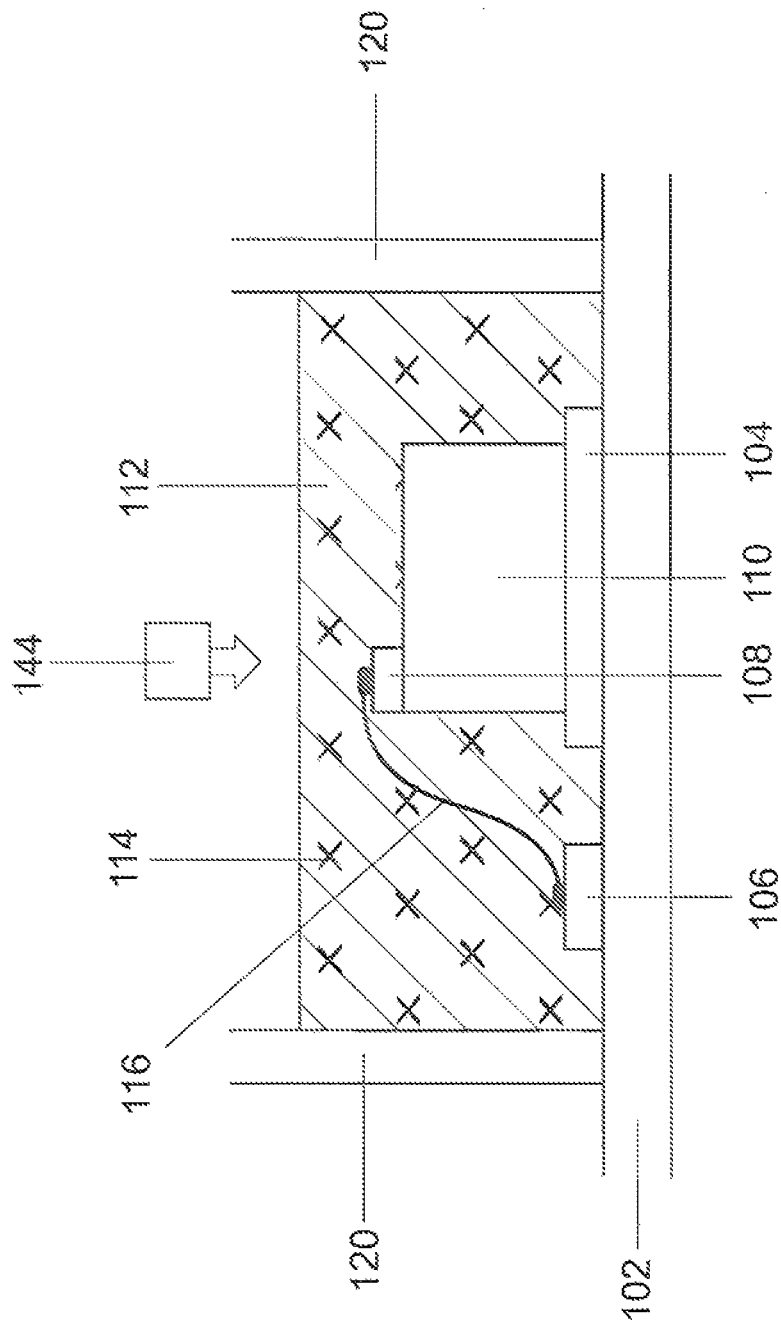

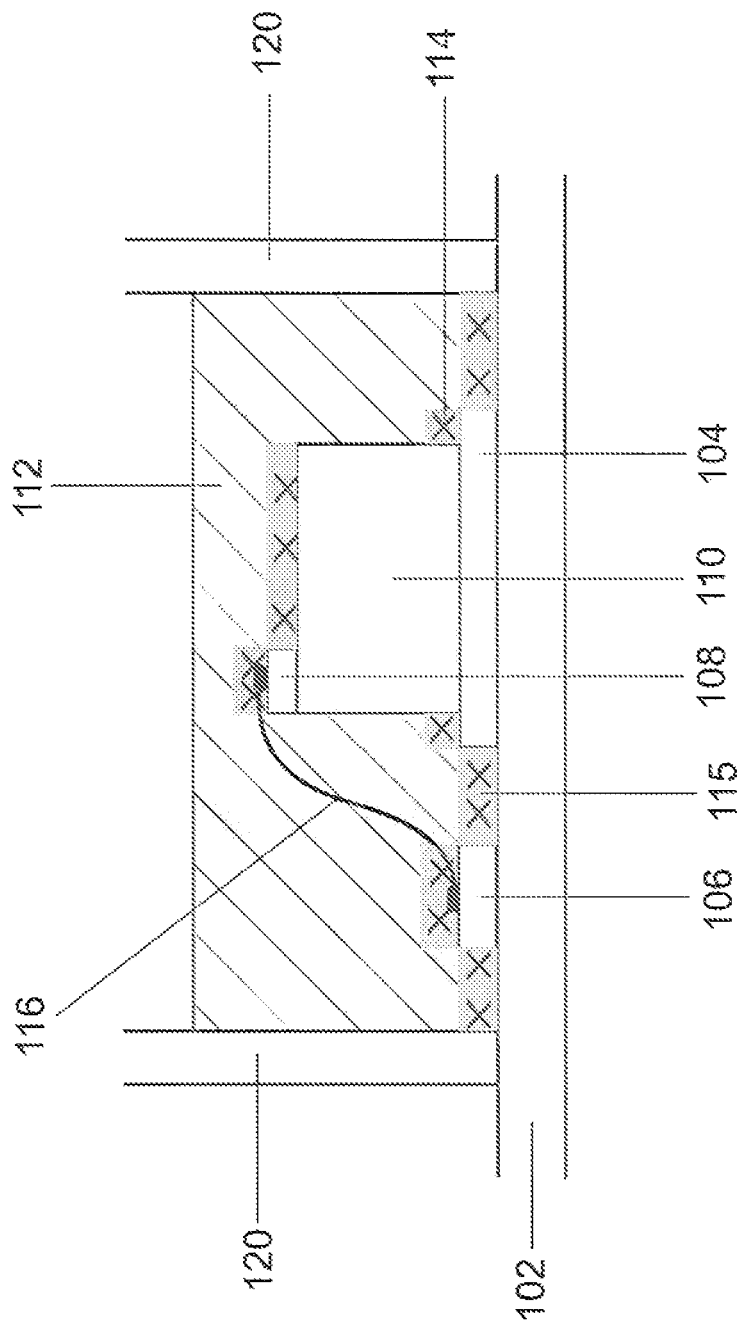
FIG B2

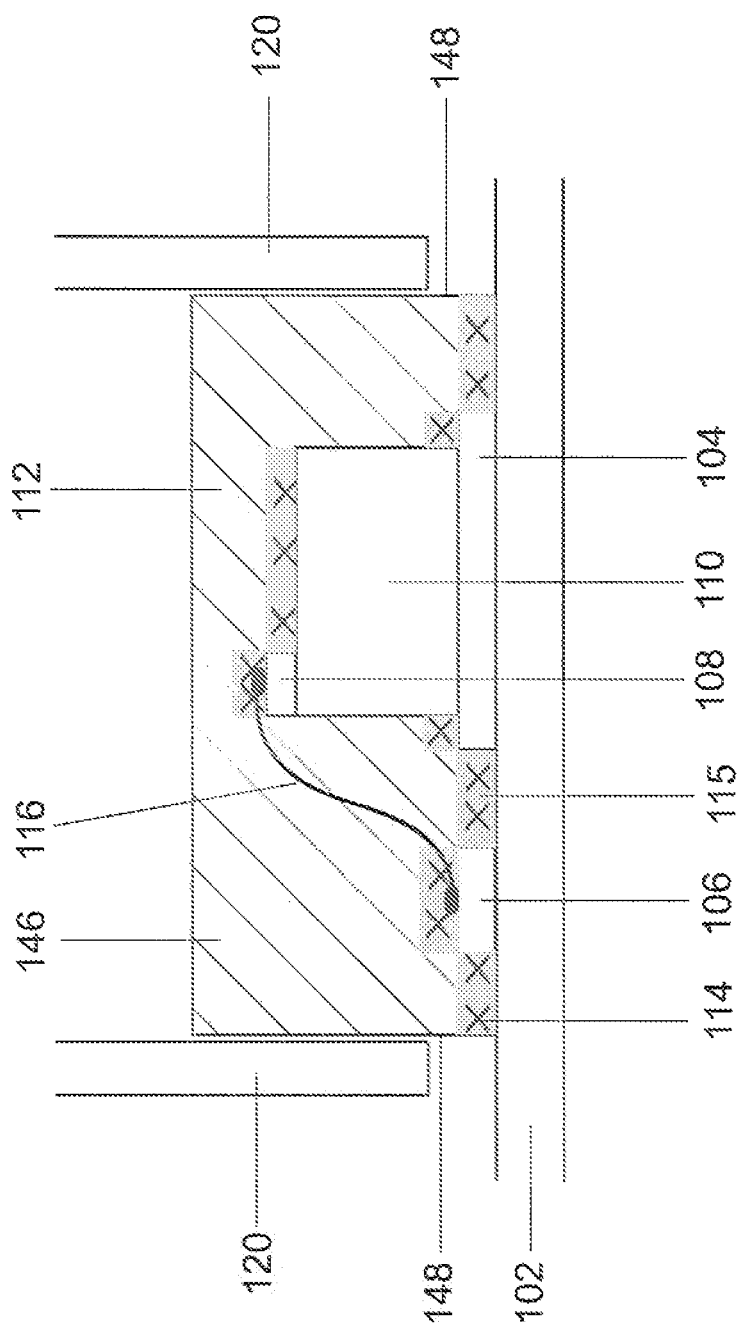

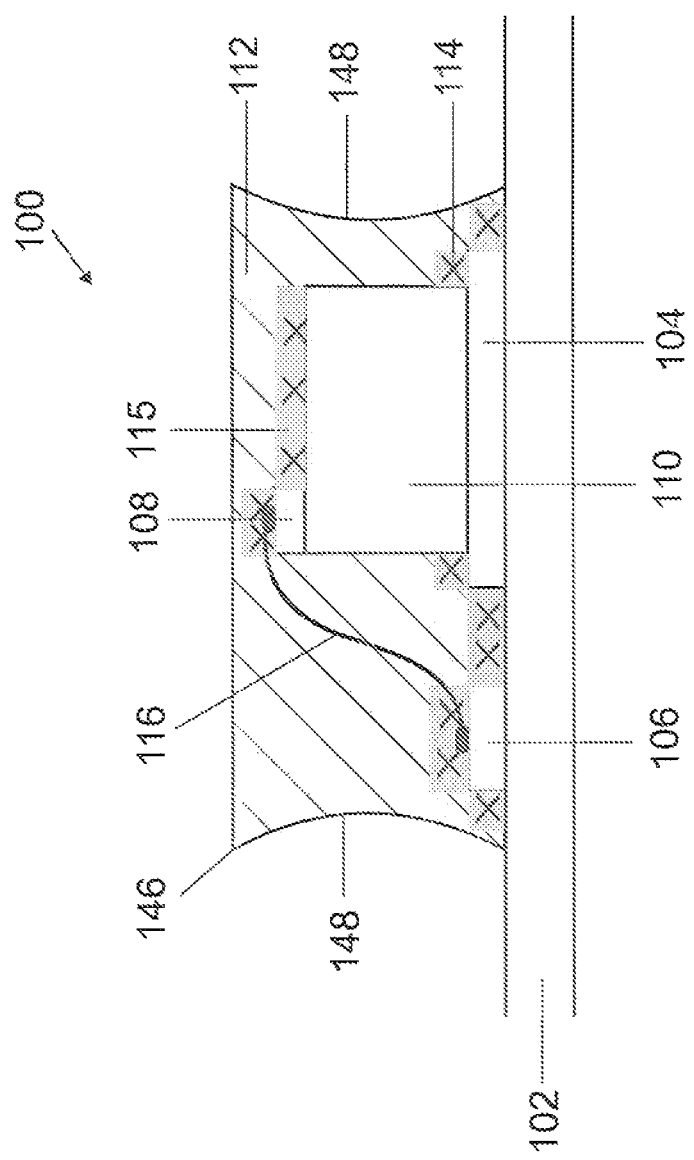

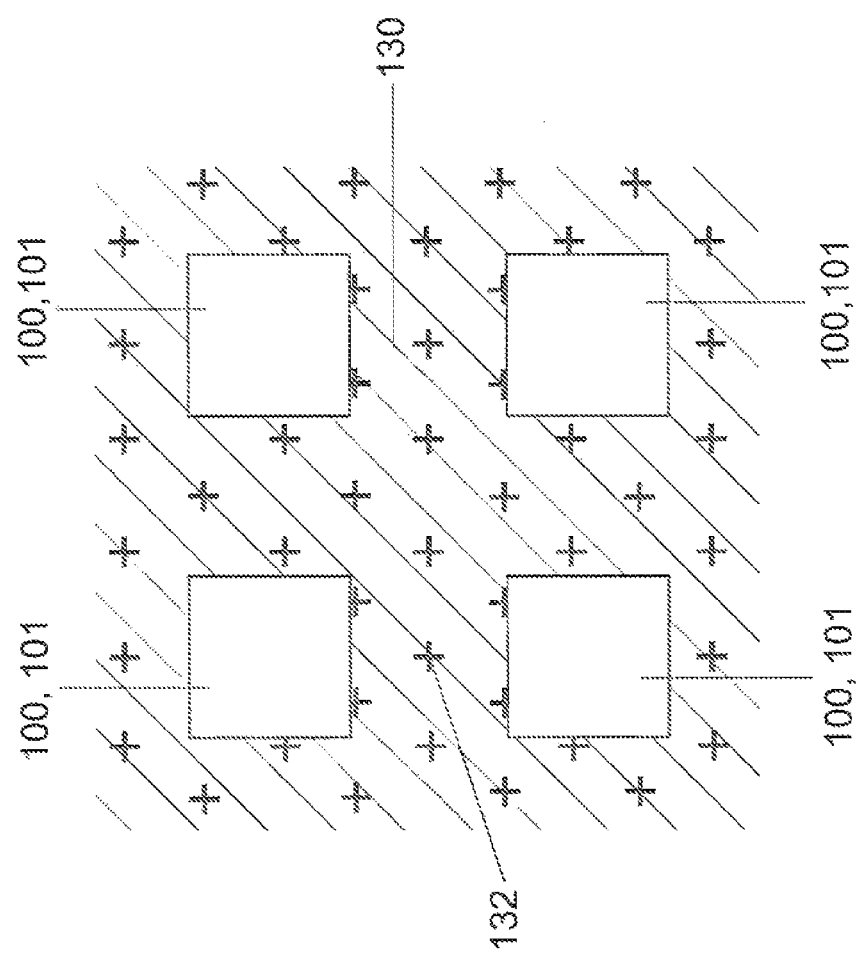

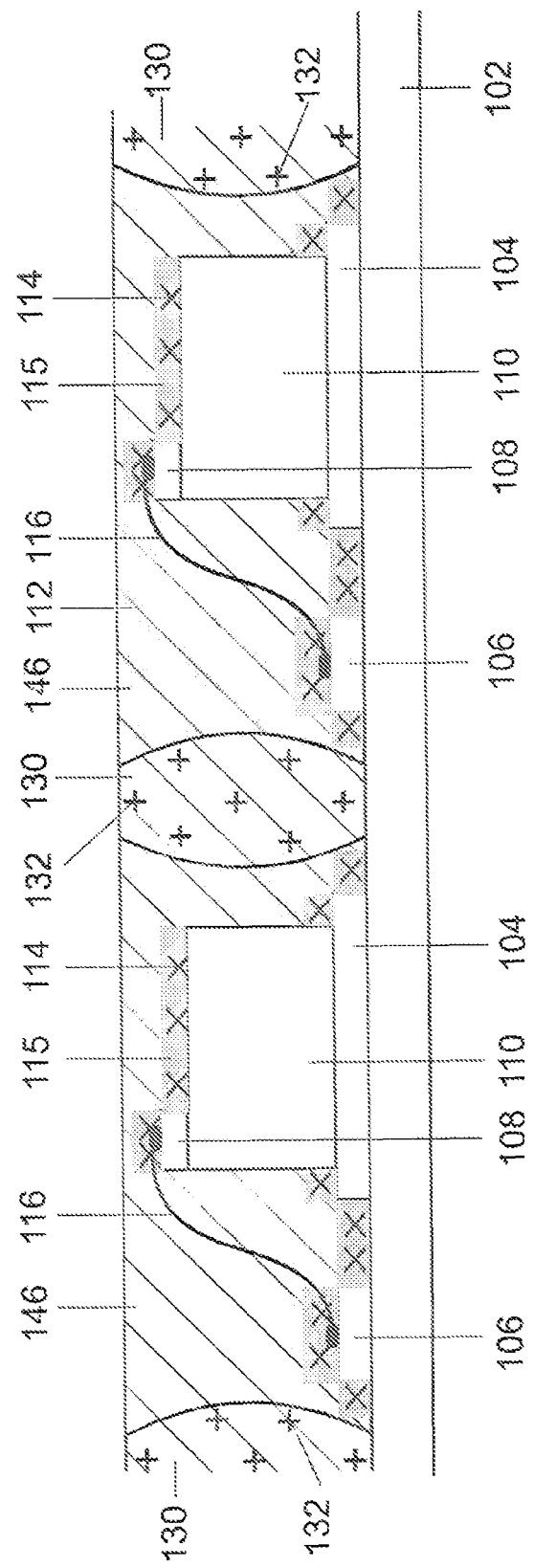
FIG 3b.1

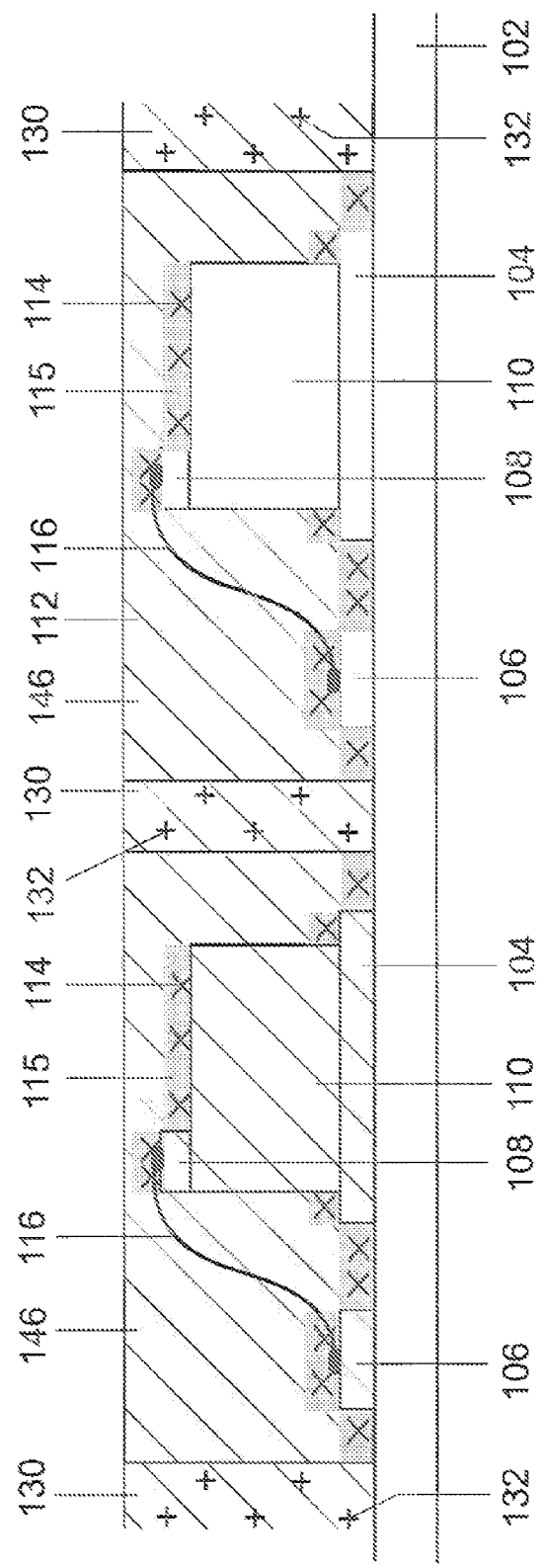
FIG 3b.2

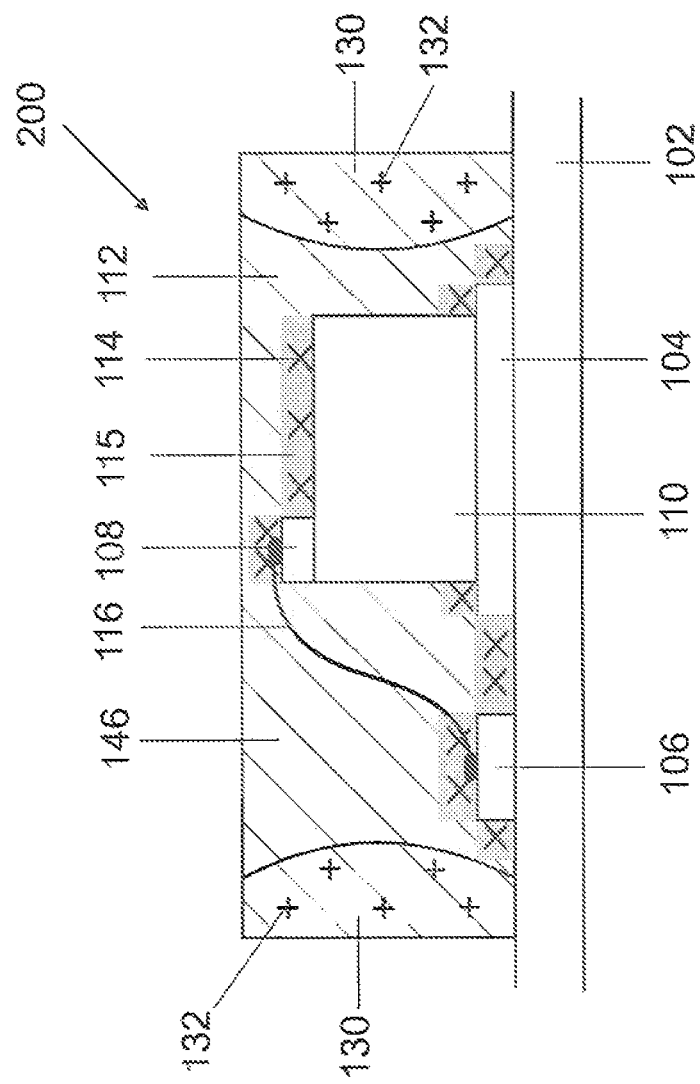
FIG 3c.1

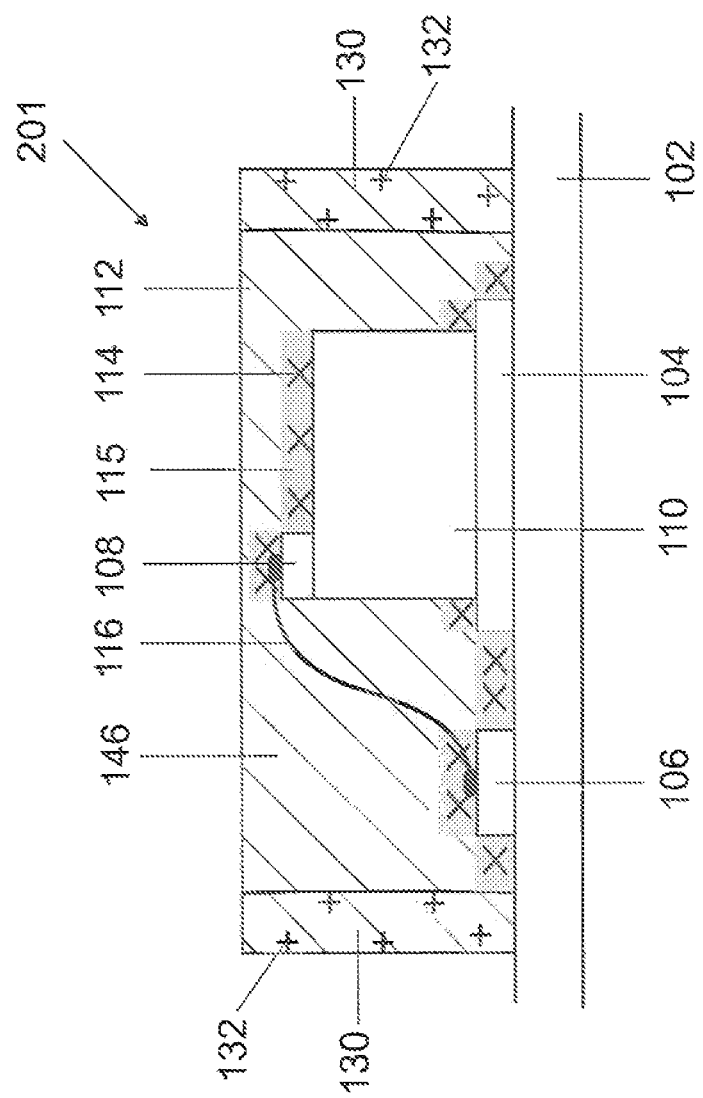
FIG 3c.2

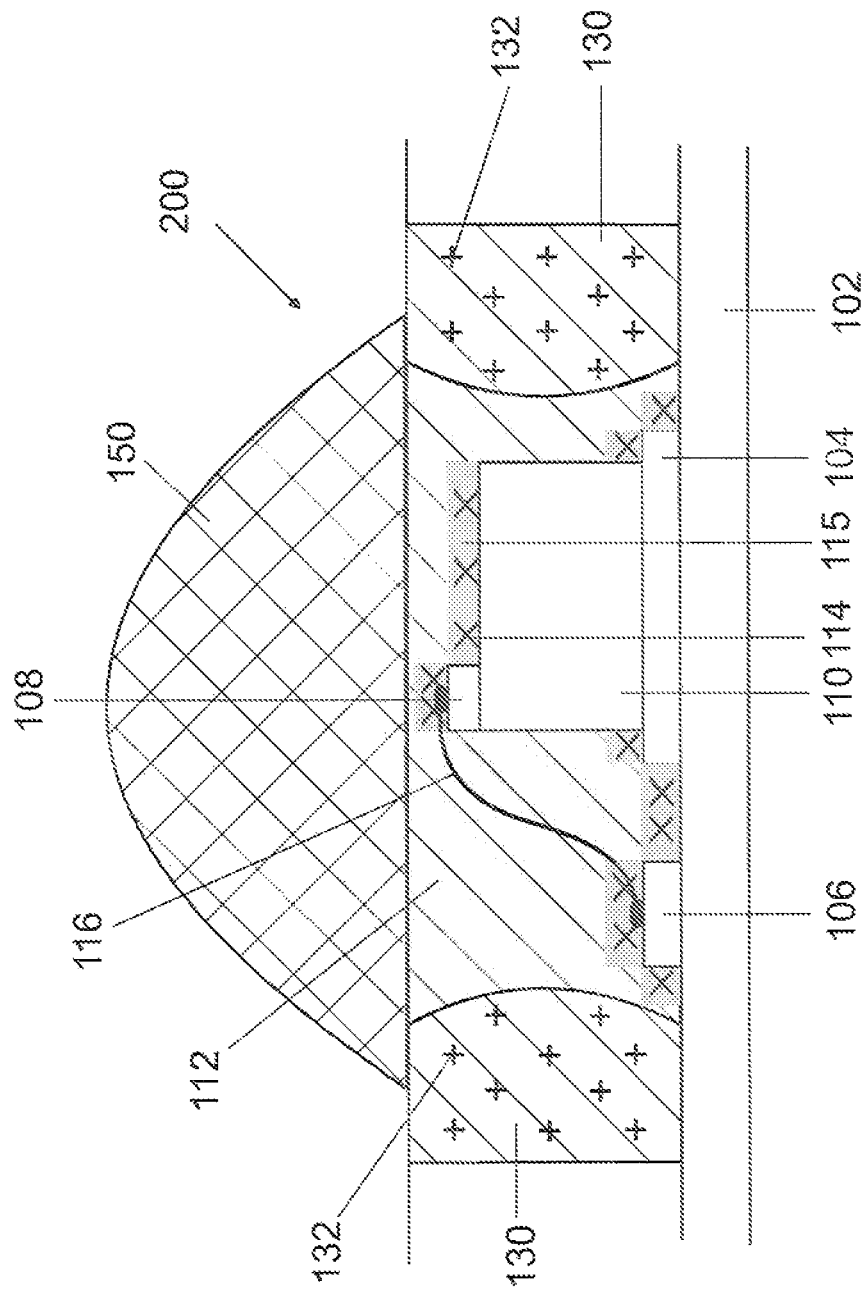

METHOD FOR PRODUCING AN OPTOELECTRONIC COMPONENT, AND OPTOELECTRONIC COMPONENT

TECHNICAL FIELD

This disclosure relates to a method of producing an optoelectronic component, and to an optoelectronic component.

BACKGROUND

An optoelectronic component comprises a semiconductor chip. Conversion material is applied on and/or around the semiconductor chip. The semiconductor chip emits primary light, for example, blue light. The conversion material comprises phosphor particles introduced, it matrix material. The phosphor particles convert short-wave primary light into longer-wave secondary light, for example, yellow light. The mixed light composed of primary and secondary light can produce white light. Heat produced in the phosphor particles during operation of the optoelectronic component (so-called Stokes shift), can damage the matrix material if the heat cannot be dissipated, or can be dissipated only to a limited extent to the semiconductor chip. In the following methods, the heat can be dissipated only to a limited extent to the semiconductor chip. The phosphor particles are on average too far away from the semiconductor chip to ensure sufficient heat dissipation.

In the case of volume potting in which phosphor particles are distributed homogeneously in a potting composed of a matrix material, the high thermal stress of the matrix material owing to the heat generated in the phosphor particles is disadvantageous. Moreover, a cavity in which the semiconductor chip can be arranged has to be present.

As an alternative to volume potting, a large lens, in particular composed of silicone, can be arranged above the semiconductor chip potted with clear matrix material. The phosphor particles are introduced in the lens and therefore relatively far away from the semiconductor chip. Here, too, the thermal properties are disadvantageous since the heat can be dissipated only to a limited extent to the semiconductor chip. The silicone in the large lens is heated greatly by the phosphor particles. The silicone becomes brittle.

It could therefore be helpful to provide a method of producing an optoelectronic component and an optoelectronic component, in which the heat generated in the phosphor particles can be effectively dissipated to the semiconductor chip.

SUMMARY

We provide a method of producing an optoelectronic component including providing, a cavity; introducing a liquid matrix material with phosphor particles distributed therein into the cavity; introducing a semiconductor chip into the matrix material; sedimenting the phosphor particles in the matrix material; and curing the matrix material, wherein a conversion layer including phosphor particles is produced, said conversion layer being arranged on the semiconductor chip.

We also provide an optoelectronic component including a substrate, a semiconductor chip arranged on the substrate, a layer composed of phosphor particles, said layer being sedimented on the semiconductor chip, and a body composed of cured matrix material, said body completely enclosing the semiconductor chip.

We further provide an optoelectronic component including a substrate, a semiconductor chip arranged on the substrate, a layer composed of phosphor particles, said layer being sedimented on the semiconductor chip, a body composed of a cured first matrix material, said body completely enclosing the semiconductor chip, and a lateral potting material including a second matrix material and scattering particles, which are introduced into the second matrix material, wherein the lateral potting laterally surrounds the body.

BRIEF DESCRIPTION OF THE DRAWINGS

Various examples of our methods and components are explained in greater detail below with reference to the drawings. Elements that an identical, of identical type or act identically are provided with the same reference signs in the figures. The figures and the size relationships of the elements illustrated in the figures among one another should not be regarded as to scale. Rather, individual elements may be illustrated with an exaggerated size or reduced size in order to enable better illustration and in order to afford a better understanding.

FIGS. A1.1, A1.2, A1.3, A1.4, A1.5, A2, A3 show intermediate products of the production method in accordance with alternative A in a sectional view.

FIGS. B1.1, B1.2, B1.3, B2, B3 show intermediate products of the production method in accordance with alternative B in a sectional view.

FIG. 2a shows an example of an optoelectronic component produced by the production method in accordance with variant A in a sectional view.

Figure 2B:
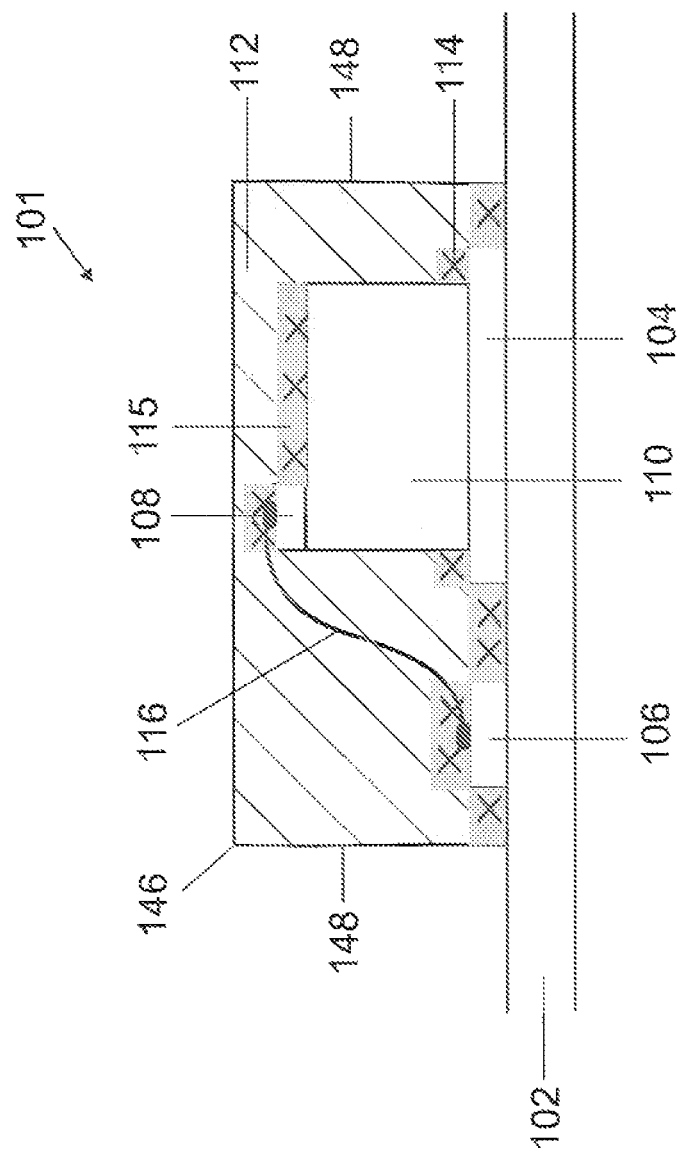

FIG. 2b shows an example of an optoelectronic component produced by the production method in accordance with variant B in a sectional view.

FIG. 3a shows an example of an arrangement with optoelectronic components with lateral scattering potting in plan view.

FIGS. 3b.1 and 3b.2, respectively, show an example of an arrangement with optoelectronic components with lateral scattering potting in a sectional view.

FIGS. 3c.1 and 3c.2, respectively, show an example of an optoelectronic component with lateral scattering potting in a sectional view.

FIG. 4 shows an example of an optoelectronic component with lateral scattering potting and a lens in a sectional view.

LIST OF REFERENCE SIGNS

100 Optoelectronic component
101 Optoelectronic component
102 Substrate
103 Cavity
104 Semiconductor chip contact layer
106 Bonding pad on substrate
108 Contact pad on semiconductor chip
110 Semiconductor chip
112 Matrix material (soft)
114 Phosphor particles
115 Conversion layer
116 Bonding wire
118 Notch in the substrate
120 Partly elastic side walls
130 Further matrix material (hard)
132 Scattering particles
140 Inelastic plate 142 Elastic side walls
144 Dispenser
146 Body
148 Side faces of the body
150 Imaging optical unit (lens)
200 Optoelectronic component
201 Optoelectronic component

DETAILED DESCRIPTION

We provide methods of producing an optoelectronic component. First, a cavity is provided. Subsequently, a liquid matrix material is introduced into the cavity. Phosphor particles are introduced in the matrix material. Subsequently, a semiconductor chip is introduced into the matrix material. The phosphor particles are subsequently sedimented in the matrix material. Subsequently, the matrix material is cured. A conversion layer comprising phosphor particles is produced in the process.

The conversion layer is arranged on the semiconductor chip in direct contact with the semiconductor chip. During wavelength conversion, the phosphor particles generate heat. As a result, the conversion layer sedimented in the matrix material and the surrounding matrix material can become heated. Since the sedimented conversion layer is arranged in direct contact with the semiconductor chip, this heat can be dissipated particularly effectively to the semiconductor chip. The semiconductor chip has a good thermal conductivity. The semiconductor chip can dissipate the heat dissipated from the phosphor particles to a substrate.

Furthermore, the flush termination of the conversion layer with the semiconductor chip can prevent the undesirable lateral emission of primary light, in particular blue light, from the optoelectronic component. With the use of semiconductor chips equipped with conversion layers, also called layer transfer method, a gap often remains between the edge of the semiconductor chip and the conversion layer. The primary light can emerge at the edge in an undesirable manner. In the case of volume emitters, based on sapphire chips, the layer transfer method is generally not possible.

Silicone, epoxy or a hybrid is used as a matrix material. Silicone-epoxy or silicone-polyester can be used as hybrids. The use of soft silicone having a degree of hardness of approximately Shore A 20 to approximately Shore A 60 preferably of approximately Shore A 40, is particularly advantageous. Soft silicones are less susceptible to cracking (higher elongation at break) and exert lower forces on the bonding wire and the semiconductor chip. It is primarily important for the matrix material to be of very low viscosity before curing. What can be achieved as a result is that phosphor particles sediment rapidly in the matrix material.

Forming a cavity is advantageous since therein even semiconductor chips on different substrates can be cast into the matrix material. A printed circuit board, a metal-core circuit board, laminates composed of a punched tape whose openings are closed or a ceramic can serve as substrate. The ceramic is particularly preferred owing to its favorable thermal properties.

The phosphor particles can comprise yttrium aluminum garnet or orthosilicates.

The phosphor particles are sedimented by the action of gravitational force and/or centrifugal force on the phosphor particles. Sedimentation is particularly advantageous since phosphor particles thereby come into direct proximity to the semiconductor chip and deposit as a conversion layer on the semiconductor chip. As a result, the heat that arises in the phosphor particles during operation of the component can be dissipated particularly well to the semiconductor chip. The matrix material is subjected to a low thermo-oxidative stress.

Curing is particularly advantageous since, from the sedimented phosphor particles, a positionally fixed conversion layer thereby arises in the cured matrix material. Curing is subdivided into initial curing during 2 min to 15 min and post-curing during 0.5 h to 4 h. Splitting the curing into initial curing and post-curing is advantageous for the following reason. After initial curing, the molds can be removed and reused for the next parts. Post-curing can be carried out in a furnace as a batch process. In other words, many substrates can be post-cured simultaneously in a single process step. Consequently, fewer potting molds are required overall, which entails a cost saving.

Sedimentation is not possible in the case of known molding methods. The molding method has an excessively high throughput for this purpose. The silicone used as matrix material in the molding method is rapidly initially cured. No time remains for sedimentation of phosphor particles. After initial curing, post-curing is effected until the matrix material is solid. Initial curing during the molding method yields 50% to 60% Shore hardness (Shore A, D) and the remaining hardness arises as a result of the post-curing.

Preferably, the cavity is produced by arrangement of elastic side walls onto an inelastic plate. The elastic side walls comprise silicone, fluoroelastomers, ethylene-propylene-diene rubber (EPDM) or a thermoplastic elastomer. The inelastic plate comprises metal. The metal can be non-stick-coated with polytetrafluoroethylene (PTFE). The elastic side walls terminate tightly with the inelastic plate. It is particularly advantageous that the cavity is reusable. The elastic side walls and the inelastic plate can be detached from the cured matrix material particularly easily for two different reasons. First, the elastic side walls and the inelastic plate can be coated with Teflon or PTFE. Second, the elastic side walls relax during the removal of the cavity when the pressure on them is reduced. The relaxed elastic side walls have no contact with the cured matrix material. Therefore, they can be detached particularly well from the cured matrix material. The elastic side walls lead to curved side faces of the optoelectronic component. During removal from the mold, the mold easily detaches from the material since the elastic side walls return again to their original straight form.

Preferably, a substrate with a semiconductor chip arranged thereon is applied to the elastic side walls of the cavity such that the semiconductor chip faces toward the inelastic plate.

Preferably, the volume, which is formed by the substrate, the inelastic plate and the elastic side walls and is filled with the matrix material is compressed. Compression is particularly advantageous since, as a result, the entire semiconductor chip is completely immersed in the liquid matrix material.

Preferably, the unit composed of substrate, inelastic plate and elastic side walls in the compressed state is rotated. The unit is rotated about an axis lying in the plane formed between semiconductor chip and substrate. The angle of rotation is 180°. This rotation is particularly advantageous since this makes it possible that the phosphor particles can be sedimented onto the semiconductor chip.

As an alternative to the cavity composed of elastic side walls and inelastic plate, the cavity can be produced by the arrangement of partly elastic side walls on a substrate. The partly elastic side walls terminate tightly with the substrate. A semiconductor chip is arranged on the substrate. Forming a cavity with partly elastic side walls is particularly advantageous since the method can be realized with particularly few and simple method steps. The partly elastic side walls can comprise Teflon, non-stick-coated metal or thermoplastics.

Therefore, the partly elastic side walls can be detached particularly easily from the cured matrix material. Moreover, the partly elastic side walls can be used repeatedly.

Removing the cavity is particularly advantageous since space for materials for further process steps thereby arises at the side faces of the optoelectronic component.

Preferably, the optoelectronic component is laterally potted with a further matrix material, into which scattering particles are introduced. This is particularly advantageous since the scattering particles scatter primary light and secondary light back into the first matrix material. This backscattered tight can be at least partly coupled out from the optoelectronic component. The laterally potted matrix material preferably comprises hard silicone. The scattering particles can comprise $TiO_2$. The silicone into which the scattering particles are introduced is preferably harder than the silicone into which the phosphor particles are introduced. The hardness range for silicone with scattering particles is greater than Shore A 60. The silicone has a high viscosity. What is achieved by the high viscosity of the silicone is that the scattering particles do not sediment. It is only if the scattering particles are also distributed as homogeneously as possible in the cured further matrix material that tight is effectively scattered back into the matrix material. Hard silicone having a Shore hardness of greater than A 60 can be used for all areas which are intended to perform a mechanical function of the housing or through which sawing is intended to be carried out. Molded lenses also comprise material having a Shore hardness of greater than A 60.

Preferably, an imaging optical unit, in particular a lens, is applied to the optoelectronic component. This can be carried out after the removal of the side walls or after the lateral potting with a second matrix material. The lens can be placed onto the optoelectronic component by overmolding. The imaging optical unit is particularly advantageous since it gathers primary and secondary light and concentrates it in the forward direction. It is also advantageous in the case of components with near-chip conversion and a lens that the electromagnetic radiation is converted in a focal plane with the chip. No light is scattered in the lens by phosphor particles.

The above-described method of producing an optoelectronic component is advantageous compared to known methods mentioned below by way of example.

In layer transfer, phosphor in the form of a converter-filled small plate is applied to that surface of the semiconductor chip facing away from the substrate. The small plate can be a silicone small plate in which the phosphor is embedded into the silicone small plate. Alternatively, the small plate can be a sintered ceramic small plate in which the phosphor is embedded into the ceramic small plate. Layer transfer is described by way of example in WO2010017831. The high costs and the undesirable lateral emission of primary light, in particular of blue light, are disadvantageous in the case of layer transfer.

In layer printing, phosphor is applied to a complete wafer by screen printing. The optoelectronic components are subsequently singulated. Layer printing is by way of example disclosed in DE102006061175. The high costs and the difficult color locus control are disadvantageous in the case of layer printing.

Various examples comprise an optoelectronic component comprising a substrate. A semiconductor chip is arranged on the substrate. A sedimented layer composed of phosphor particles is arranged on the semiconductor chip. The semiconductor chip is completely enclosed by a body composed of cured matrix material. The conversion layer completely covers that surface of the semiconductor chip facing away from the substrate. This arrangement is advantageous for a number of reasons. First, as a result of the direct contact between the conversion layer and the semiconductor chip, the heat generated in the conversion layer can be dissipated particularly well to the semiconductor chip. This improves the thermal properties of the optoelectronic component. Second, color homogeneity over the viewing angle is improved.

Preferably, the body has concavely curved side faces.

Preferably, the body has straight side faces perpendicular to the substrate.

Preferably, the conversion layer has a homogeneous thickness. This is advantageous since it is thereby possible to achieve a uniform intensity of wavelength-converted secondary light over the viewing angle. This also results in a white mixed light having a virtually uniform color temperature over all viewing angles.

Preferably, the optoelectronic component comprises a lateral potting composed of a second matrix material with scattering particles embedded therein. Silicone can be used as a second matrix material. $TiO_2$, particles can be used as scattering particles. This example is advantageous since the primary light and the secondary light that leaves the component in a lateral direction is reflected back into the component. The use of highly viscous silicone as further matrix material is particularly advantageous since the scattering particles are not intended to sediment prior to curing. Additionally or alternatively, the sedimentation speed can be influenced by the size of the scattering particles. The smaller the scattering particles, the more slowly the scattering particles sediment. Additionally or alternatively, the sedimentation can be influenced by immediate curing after potting.

Preferably, the semiconductor chip arranged in the optoelectronic component can be based on a III-V compound semiconductor material. GaN and InGaN can be used as material system. The semiconductor chips comprise at least one active zone which emits electromagnetic radiation. The active zones can be pn junctions, double heterostructure, multiquantum well structure (MQW), single quantum well structure (SQW). Quantum well structure means: quantum wells (3-dim), quantum wires (2-dim) and quantum dots (1-dim).

The semiconductor chip can be designed as a surface emitter, in particular as a so-called thin-film chip. The thin-film chip is known, for example, from WO2005081319A1.

Figure 1:
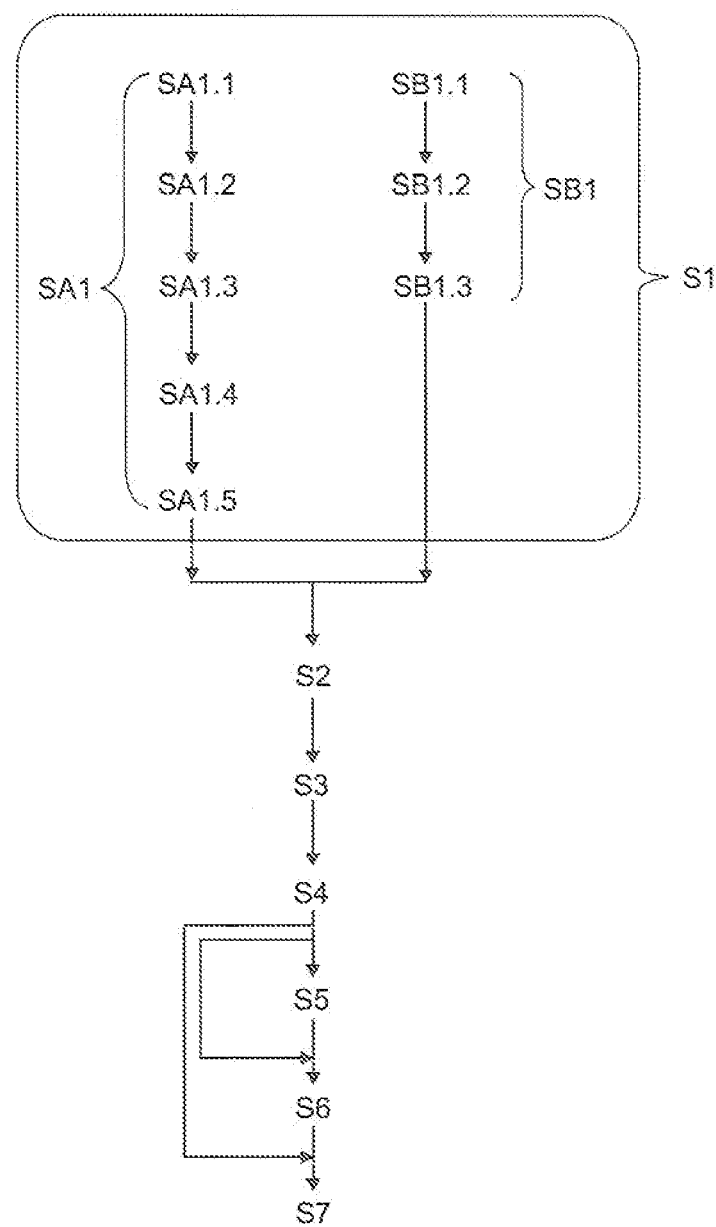
FIG. 1 shows a flow chart of two alternative production methods A and B for an optoelectronic component.

Turning now to the drawings, FIG. 1 shows a flow chart of two alternative production methods A and B for an optoelectronic component. The production process can be subdivided into steps S1 to S4. Steps S5, S6 and S7 are optional.

In step S1, a semiconductor chip 110 is introduced into a first liquid matrix material 112 with phosphor particles 114 distributed homogeneously therein. FIG. 1 shows two alternative ways SA1 and SB1 to embody method step S1.

The first alternative SA1 has sub-steps SA1.1, SA1.2, SA1.3, SA1.4 and SA1.5.

In sub-step SA1.1, an inelastic plate 140 with elastic side walls 142 arranged thereon is provided. The elastic side walls 142 can comprise silicone, fluoroelastomers, ethylene-propylene-diene rubber (EPDM) or a thermoplastic elastomer. The elastic side walls 142 do not comprise any sulphur. The intermediate product associated with sub-step SA1.1 is illustrated in FIG. A1.1. The elastic side walls 142 terminate tightly with the inelastic plate 140 and thus form a cavity.

In sub-step SA1.2, the cavity composed of inelastic plate 140 and the elastic side walls 142 is filled with a liquid matrix material 112 from a dispenser. A silicone, an epoxy or a hybrid can be provided as matrix material 112. Phosphor particles 114 can be introduced into the matrix material 112. Yttrium aluminum garnet or orthosilicates or can be used as phosphor particles 114. The intermediate product associated with sub-step SA1.2 is illustrated in FIG. A1.2. The phosphor particles 114 can be distributed homogeneously in the matrix material 112. Only up to approximately ¾ of the volume of the cavity is filled with the matrix material 112.

In sub-step SA1.3, a substrate 102 with a semiconductor chip 110 arranged thereon is applied to the elastic side walls 142 of the cavity 103 such that the semiconductor chip 110 faces toward the inelastic plate 140. The assembled substrate 102 is applied to the cavity in an autoclave or in a vacuum. The semiconductor chip 110 can at least partly dip into the first matrix material 112. The intermediate product associated with sub-step SA1.3 is illustrated in FIG. A1.3. The semiconductor chip 110 is connected to the substrate 102 via a semiconductor chip contact layer 104. The substrate 102 can be a ceramic substrate. A contact pad 108 is provided on the semiconductor chip 110. A bonding pad 106 is arranged on the substrate 102. A bonding wire 116 provides the electrical connection of contact pad 108 and bonding pad 106. A notch 118 can be introduced in the substrate 102.

In sub-step SA1.4, the volume which is formed by substrate 102, inelastic plate 140 and the elastic side walls 142 and is filled with the liquid matrix material 112 is compressed. The flexible cavity 103 with the elastic side walls 142 follows the form of the ceramic substrate 102. The compression also results in compensation of volume fluctuations. Thus, a possible non-uniformity in the substrate, in particular in the form of a notch 118, can be compensated for. The intermediate product associated with sub-step SA1.4 is illustrated in FIG. A1.4. The volume formed from elastic side walls 142, inelastic plate 140 and substrate 102 is completely filled with the matrix material 112. The phosphor particles 114 are distributed approximately homogeneously. The elastic side walls 142 are deformed by the pressing-on pressure. In particular, the elastic side walls 142 are bulged out in the direction toward the cavity and shortened in the direction perpendicular to the inelastic plate 140.

In sub-step SA1.5, the dosed unit composed of substrate 102, inelastic plate 140 and elastic side walls 142 in the compressed state is rotated by 180°. The unit is rotated about an axis lying in the plane formed between semiconductor chip and substrate. The intermediate product associated with sub-step SA1.5 is illustrated in FIG. A1.5. The matrix material 112 still fills the entire volume of the closed unit. The phosphor particles 114 are still distributed homogeneously in the matrix material 112.

The second alternative SB1 comprises sub-steps SB1.1, SB1.2, SB1.3.

In sub-step SB1.1, a semiconductor chip 110 is provided on a substrate 102. The intermediate product associated with sub-step SB1.1 is illustrated in FIG. B1.1. The semiconductor chip 110 is electrically and mechanically connected to the substrate 102 via the semiconductor chip contact layer 104. The contact pad 108 on the semiconductor chip 110 is electrically conductively connected to the bonding pad 106 on the substrate via the bonding wire 116.

In sub-step SB1.2, a cavity 103 is produced by partly elastic, side walls 120 being placed onto the substrate 102. The intermediate product associated with sub-step SB1.2 is illustrated in FIG. B1.2. The partly elastic side walls 120 terminate tightly with the substrate 102. This produces the cavity, which completely accommodates the semiconductor chip 110 with its contact pad 108, the bonding wire 116 and the bonding pad 106.

In sub-step SB1.3, the volume formed by substrate 102 and partly elastic side walls 120 is filled with a liquid matrix material 112. A dispenser 144 is used for this purpose. Phosphor particles 114 are introduced into the first matrix material 112. The intermediate product associated with sub-step SB1.3 is illustrated, in FIG. B1.3. The semiconductor chip 110 with its contact pad 108, the bonding wire 116 and the bonding pad 106 are completely encapsulated in the matrix material 112. The phosphor particles 114 are distributed approximately homogeneously in the first matrix material 112. Advantageously, the liquid matrix material 112 can be metered from above. The substrate 102 no longer dips into the liquid matrix material 112. The unit composed of substrate 102 and partly elastic side walls 120 no longer has to be rotated before the step for sedimentation. The risk of bubble formation is reduced.

In step S2, the phosphor particles 114 are sedimented. The sedimentation is carried out over 1 h to 12 h at a slightly elevated temperature of between 25° C. and 70° C. The driving force that acts on the phosphor particles 114 can be the gravitational force. Alternatively, the sedimentation can be carried out in a centrifuge. The driving force here is the centrifugal force. A combination of both sedimentation methods can also be employed. The intermediate products associated with step S2 are illustrated in FIGS. A2 and B2. The phosphor particles 114 are sedimented on that surface of the semiconductor chip 110 which faces away from the substrate 102, on the regions of the semiconductor chip contact layer 104 which are not covered by the semiconductor chip 110, on the contact pad 108, on the bonding pad 106 and on exposed regions of the substrate 102. A conversion layer 115 is formed. The matrix material 112 adjoining the conversion layer 115 is virtually clear. In other words, between the conversion layer 115 and the interface between air/matrix material 112, only very few phosphor particles 114 are present in the matrix material 112. The proportion of phosphor particles is 0.5%-5% percent by weight.

In step S3, the first matrix material 112 with the conversion layer 115 comprising phosphor particles 114 is cured. First, the first matrix material 112 is initially cured during a time period of 2 min to 15 min. This is followed by post-curing during a time period of 1 h to 4 h.

In step S4, the side walls 142 or 120 are removed. FIGS. A3 and B3 show the intermediate products during the removal of the lateral walls 142 and 120, respectively. FIG. A3 shows the intermediate product in the case of elastic side walls 142. The elastic deformation relaxes as the elastic side walls 142 are lifted off. The elastic side walls 142 lift off in a simple manner from the semiconductor chip 110 encapsulated in the first matrix material 112. FIG. B3 shows the intermediate product in the case of partly elastic side walls 120. The partly elastic side walls 120 can be provided with a non-stick coating, in particular Teflon, thereby facilitating the detachment of the partly elastic side walls 120 from the encapsulated semiconductor chip 110.

Examples of the end product, the optoelectronic component 100 or the optoelectronic component 101, result after step S4 has been carried out. The optoelectronic component 100, 101, 200, 201 comprises a substrate 102, on which a semiconductor chip 110 is arranged. A layer 115 composed of phosphor particles 114 is sedimented on the semiconductor chip. A body 146 composed of cured matrix material 112 completely encloses the semiconductor chip 110.

FIG. 2a shows the optoelectronic component 100 resulting from the production method having sub-step SA1. The body 146 has concavely curved side faces 148.

FIG. 2b shows the optoelectronic component 101 resulting from the production method having sub-step SB1. The body 146 has straight side faces 148 that are perpendicular to the substrate 102.

FIG. 2a differs from FIG. 2b only in the lateral form of the cured matrix material 112. Since this lateral form has no influence on the properties of the optoelectronic components 100 and 101, respectively, FIG. 2b and FIG. 2a are described jointly below.

The conversion layer 115 has a concentration of phosphor particles 114 of 20%-95% percent by weight. The phosphor particles 114 of the conversion layer 115 are embedded into a matrix material 112, in particular into a silicone, into an epoxy or into a hybrid. The conversion layer 115 has a homogeneous thickness of 5 μm-120 μm.

In the optional step S5, the semiconductor chip 110 completely potted with the matrix material 112 is laterally potted with a further matrix material 130. The further matrix material 130 can be harder than the matrix material 112. Scattering particles 132 are distributed homogeneously in the further matrix material 130. FIGS. 3a, 3b.1 and 3b.2 show the product after step S5 has been carried out. FIG. 3a shows a plan view of a product having four optoelectronic components 100, 101. The cured further matrix material 130 is arranged between the optoelectronic components 100, 101. FIGS. 3b.1 and 3b.2 show schematic lateral sectional views of the product. The majority of the primary light and of the secondary light emitted by the conversion layer 115 leaves the optoelectronic component 100 and respectively 101 through the substantially clear matrix material 112 on that surface of the semiconductor chip 110 which faces away from the substrate 102. Laterally emitted mixed light can penetrate into the region with the further, harder matrix material 130. The scattering particles 132 embedded in the further matrix material 130 can backscatter the mixed light. The backscattered mixed light can at least partly leave the optoelectronic component.

In an optional step S6, the arrangement having a plurality of potted semiconductor chips 110 as shown in FIGS. 3a, 3b.1 and 3b.2 can be separated into individual optoelectronic components 200 and 201, respectively. This can be achieved by a sawing process, in particular laser sawing. The result of step S6 is shown in FIG. 3c.1 and FIG. 3c.2. FIG. 3c.1 shows an example of an optoelectronic component 200 which emerges as a result of singulation from the arrangement in FIG. 3b.1. FIG. 3c.2 shows an example of an optoelectronic component 201 which emerges as a result of singulation from the arrangement in FIG. 3b.2.

In the optional step S7, a lens 150 is placed onto the potted semiconductor chip 110. Step S7 can directly follow step S4, directly follow step S5 or directly follow step S6. The placement of the lens 150 can be effected by overmolding a clear potting material, in particular silicone, onto the potted semiconductor chip 110. In the example shown in FIG. 4, the lens 150 is placed onto the optoelectronic component 200 shown in FIG. 3c.1. The clear potting material of the lens 150 is harder than the matrix material 112 with which the semiconductor chip 110 is potted. This facilitates handling during the shaping of the lens. The lens 150 overlaps the regions of the further matrix material 130 into which the scattering particles 132 are embedded. This increases the proportion of mixed light which can be gathered by the lens 150.

The invention claimed is:

1. A method of producing an optoelectronic component comprising:
    providing a cavity;
    introducing a liquid matrix material with phosphor particles distributed therein into the cavity;
    introducing a semiconductor chip into the matrix material after the liquid matrix material is introduced into the cavity;
    sedimenting the phosphor particles in the matrix material;
    curing the matrix material, wherein a conversion layer comprising phosphor particles is produced, said conversion layer being arranged on the semiconductor chip; and
    laterally potting the optoelectronic component with a further matrix material, into which scattering particles are introduced after the conversion layer is produced, wherein the scattering particles are distributed homogeneously in the further matrix material.

2. The method according to claim 1, wherein the cavity is removed after the matrix material has been cured.

3. The method according to claim 1, wherein the cavity is produced by arrangement of elastic side walls onto an inelastic plate.

4. The method according to claim 3, further comprising applying a substrate with a semiconductor chip arranged thereon to the elastic side walls of the cavity such that the semiconductor chip faces toward the inelastic plate.

5. The method according to claim 4, wherein a volume formed by the substrate, the inelastic plate and the elastic side walls and is filled with the matrix material is compressed.

6. The method according to claim 5, wherein a unit composed of substrate, inelastic plate and elastic side walls, in the compressed state, is rotated by 180° about an axis lying in the plane formed between semiconductor chip and substrate.

7. The method according to claim 2, further comprising removing the cavity.

8. The method according to claim 1, wherein the cavity is produced by arrangement of partly elastic side walls on a substrate, and a semiconductor chip is arranged on the substrate.

9. The method according to claim 8, wherein the cavity is removed by the partly elastic side walls being detached from the substrate.

10. The method according to claim 1, wherein an imaging optical unit is applied to the optoelectronic component.

* * * * *